United States Patent [19]
Fujii

[11] Patent Number: 6,122,210
[45] Date of Patent: Sep. 19, 2000

[54] DATA OUT BUFFER CIRCUIT AND SRAM

[75] Inventor: Moyuru Fujii, Tokyo, Japan

[73] Assignee: NEC Corporation, Tokyo, Japan

[21] Appl. No.: 09/335,747

[22] Filed: Jun. 18, 1999

[30] Foreign Application Priority Data

Jun. 26, 1998 [JP] Japan .................................. 10-180563

[51] Int. Cl.[7] .............................. G11C 7/00; G11C 16/04; G11C 8/00
[52] U.S. Cl. ................ 365/203; 365/189.05; 365/230.08
[58] Field of Search ............... 365/203, 189.05, 365/230.08; 326/115

[56] References Cited

U.S. PATENT DOCUMENTS

| | | | |
|---|---|---|---|
| 5,311,471 | 5/1994 | Matsumoto et al. | 365/203 |
| 5,408,437 | 4/1995 | Cho et al. | 365/203 |
| 5,583,456 | 12/1996 | Kimura | 326/115 |
| 5,654,927 | 8/1997 | Lee | 365/203 |
| 5,694,369 | 12/1997 | Abe | 365/203 |
| 5,886,936 | 3/1999 | Yang | 365/203 |

FOREIGN PATENT DOCUMENTS 62-298088  12/1987  Japan .

*Primary Examiner*—Trong Phan
*Attorney, Agent, or Firm*—Sughrue, Mion, Zinn, Macpeak & Seas, PLLC

[57] ABSTRACT

It is an object of the invention to ensure a signal transmission time of a data out buffer circuit of a SRAM which adopts a pre-charge system. The data out buffer circuit is provided with a pre-charge circuit for pre-charging a write/read bus during a period of pre-charge and a data latch circuit for holding a data read before then during the period of pre-charge. The data out buffer circuit outputs the data held in the data latch circuit during the period of pre-charge to the outside via a data output circuit. The reliability of the data transmission achieved by the extended holding time of the output data and the improvement of access speed achieved by pre-charge can be both realized.

6 Claims, 5 Drawing Sheets

Q1, Q2, Q5, Q6, Q9 : PMOS TRANSISTOR
Q3, Q4, Q7, Q8, Q10 : NMOS TRANSISTOR

6,122,210

DATA OUT BUFFER CIRCUIT AND SRAM

FIELD OF THE INVENTION

The invention relates to a data out buffer circuit, and a static random access memory (a SRAM, hereinafter) using the same, and specifically to improvement of a output data-holding characteristic of a SRAM, which adopts a pre-charge system and is designed to increase the speed of data-reading.

BACKGROUND OF THE INVENTION

Recently, a SRAM adopts a pre-charge circuit, which raises a potential of a write/read bus to a predetermined level in advance of data-reading in order to improve the speed of data-reading. Thereafter, a conventional data out buffer circuit of the SRAM provided with the pre-charge circuit will be explained.

A conventional data out buffer circuit is composed of a write/read bus which transmits an output signal of a sense amplifier, the above-mentioned pre-charge circuit, and a data output circuit which is supplied with a data transmitted from the sense amplifier via the write/read bus. In a period of data-reading, the pre-charge circuit is inoperative, and the data supplied from the sense amplifier is transmitted directly to the data output circuit. However, during the period of pre-charge, since the potential of the write/read bus is maintained at a predetermined level, it becomes impossible to hold the data read before then on the write/read bus. That is to say, the conventional data out buffer is defective in an output data holding-characteristic, and further improvement is extremely desirable.

SUMMARY OF THE INVENTION

Accordingly, it is an object of the invention to provide a data out buffer circuit which can hold a data read from a memory cell, while a read/write bus is pre-charged, and to improve an output data-holding characteristic of a data out buffer circuit for a SRAM which adopts a conventional pre-charge system.

It is a further object of the invention to provide a SRAM having a data output buffer circuit with an improved output data-holding characteristic.

According to the first feature of the invention, a data out buffer circuit comprises:

a write/read bus supplied with data to be read in a period of read, a pre-charge circuit, which maintains a potential of the write/read bus at a predetermined level during a period of pre-change, a data latch circuit, which latches the data to be read during the period of pre-charge subsequent to the period of read, and a data output circuit, which transmits an output of the data latch circuit to an outside.

According to the second feature of the invention, a SRAM comprises:

a data out buffer circuit, which comprises a wire/read bus supplied with data to be read in a period of read, a pre-charge circuit for maintaining a potential of the write/read bus at a predetermined level during a period of pre-charge, a data latch circuit for latching the data to be read during the period of pre-charge subsequent to the period of read, and a data output circuit for transmitting an output of the data latch circuit to an outside;

a SRAM memory cell for storing the data to be read, and a sense amplifier for amplifying the data read from the SRAM memory cell, and supplying it to the write/read bus.

A write/read bus which transmits data to be latched by a data out buffer circuit according to the invention is a single phase transmission line which transmits the data through a signal conductor. That is to say, the write/read bus used in the data out buffer circuit according to the invention is different from a pair of bit lines, which is commonly used in a memory cell array and transmits complementary signals. In a memory circuit disclosed in Japanese Patent Kokai 62-298088, complementary signals with small amplitudes, which are composed of data read from a memory cell via a pair of bit lines, are transmitted therethrough and latched by a loop circuit. However, the write/read bus, on which a latch circuit according to the invention is situated, is a single phase bus, which transmits the data with an amplitude of a power supply voltage in full swing. Heretofore, a circuit, which latches the data transmitted through the single phase write/read bus in full swing and holds it for a predetermined period, has never been proposed.

BRIEF DESCRIPTION OF THE DRAWINGS

The invention will be explained in more detail in conjunction with appended drawings, wherein.

DESCRIPTION OF THE PREFERRED EMBODIMENTS

Before explaining a data out buffer circuit in the preferred embodiments according to the invention, the aforementioned conventional data out buffer circuit will be explained in FIGS. 1 and 2.

Figure 1:
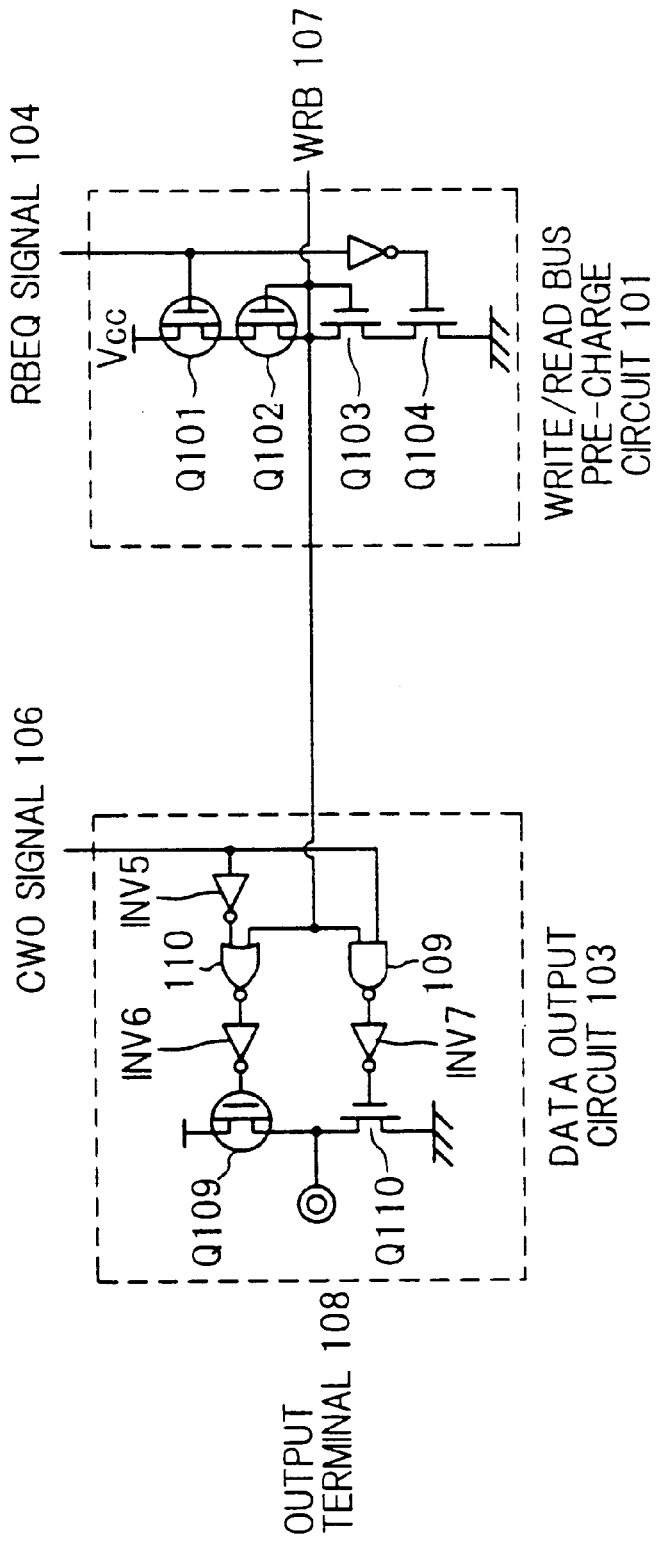
FIG. 1 shows a circuit diagram of a conventional data out buffer circuit.
Figure 2:
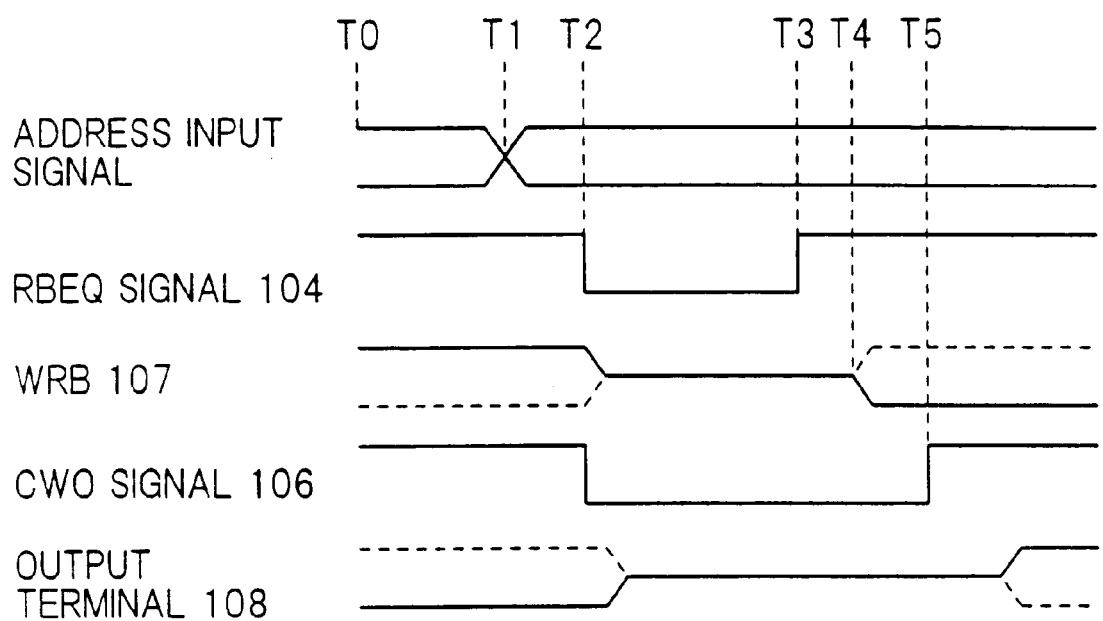
FIG. 2 is a signal timing chart of an operation of a data out buffer circuit shown in FIG. 1.

FIG. 1 shows a circuit diagram of a conventional data out buffer circuit, and FIG. 2 show a timing chart of an operation of the same. T0 is in a period of data-reading. At this time, an address transfer detection signal (a RBEQ signal, hereinafter) 104 is at a high logical level, and a data output circuit control signal (a CWO signal, hereinafter) 106 for controlling the operation of the data output circuit 103 is at a high logical level. A potential of a write/read bus (a WRB signal, hereinafter) 107 for transmitting an output of a sense amplifier (not shown) is changed between a power supply voltage and the ground potential in full swing. Suppose that a data to be transmitted is at a high logical level.

Since the RBEQ signal 104 is at a high logical level, a P channel type MOS (PMOS, hereinafter) transistor Q101 and a N channel type MOS (NMOS, hereinafter) Q104 are both off, hence a write/read bus pre-charge circuit 101 is inoperative. Moreover, since the CWO signal 106 is at a high logical level also, the data output circuit 103 outputs a data of a low logical level to the outside of the SRAM via the output terminal 108.

At a time T1, an address input signal supplied from the outside of the SRAM is assumed to be changed. The change of the address input signal is detected by an address transfer detection circuit (not shown). At a time T2, the level of the RBEQ signal 104 is changed to a low logical level, and a period of pre-charge starts. At the same time, a PMOS transistor 109 and a NMOS transistor 110 are both turned off, and the data output circuit 103 becomes inoperative. Moreover, since the RBEQ signal 104 is at a low logical level, the PMOS transistor Q101 and the NMOS transistor 104 are both turned on, and the write/read bus pre-charge circuit 101 becomes operative.

A gate and a drain of the PMOS transistor Q102 are connected with the write/read bus 107, and a gate and a drain of the NMOS transistor Q103 are connected with the same also. Accordingly, since a through current flows through the write/read bus pre-charge circuit 101, the write/read bus 107 is charged and the potential of the same is raised to Vcc/2, which corresponds to a half of the power supply voltage Vcc. At this time, the write/read bus 107 loses a data to be transmitted to the data output circuit 103. At the same time, since the data output circuit 103 is not operative, the potential of the write-read bus 107 is never transmitted to the outside during the period of pre-charge.

Subsequently, the RBEQ signal again becomes high at a time T3, the period of pre-charge is over, and the period of data-reading restarts. If a data is transmitted to the write/read bus 107 at a time T4, the level of the CWO signal 106 is at a high logical level at a time T5, and the data output circuit 103 becomes operative. Thereby, the data, which is read from a memory cell and transmitted to the write/read bus 107, is supplied to the outside.

In the aforementioned data out buffer circuit, the write/read bus 107 is pre-charged in advance of data-reading, the potential of the same is once raised to Vcc/2, and by such a design, speed of data transmission can be improved. However, in the conventional circuit, since a data previously transmitted to the write/read bus is lost at the time of pre-charge, it is necessary to once make the level of the CWO signal be a low logical level and the data output circuit 103 be inoperative at the time of pre-charge. Accordingly, the data cannot be transmitted after an address is changed, and a output data-holding time, in which the data can be transmitted to the outside, is shortened. In other words, there is a disadvantage that a output data-holding characteristic is poor in the conventional data out buffer circuit.

Figure 3:
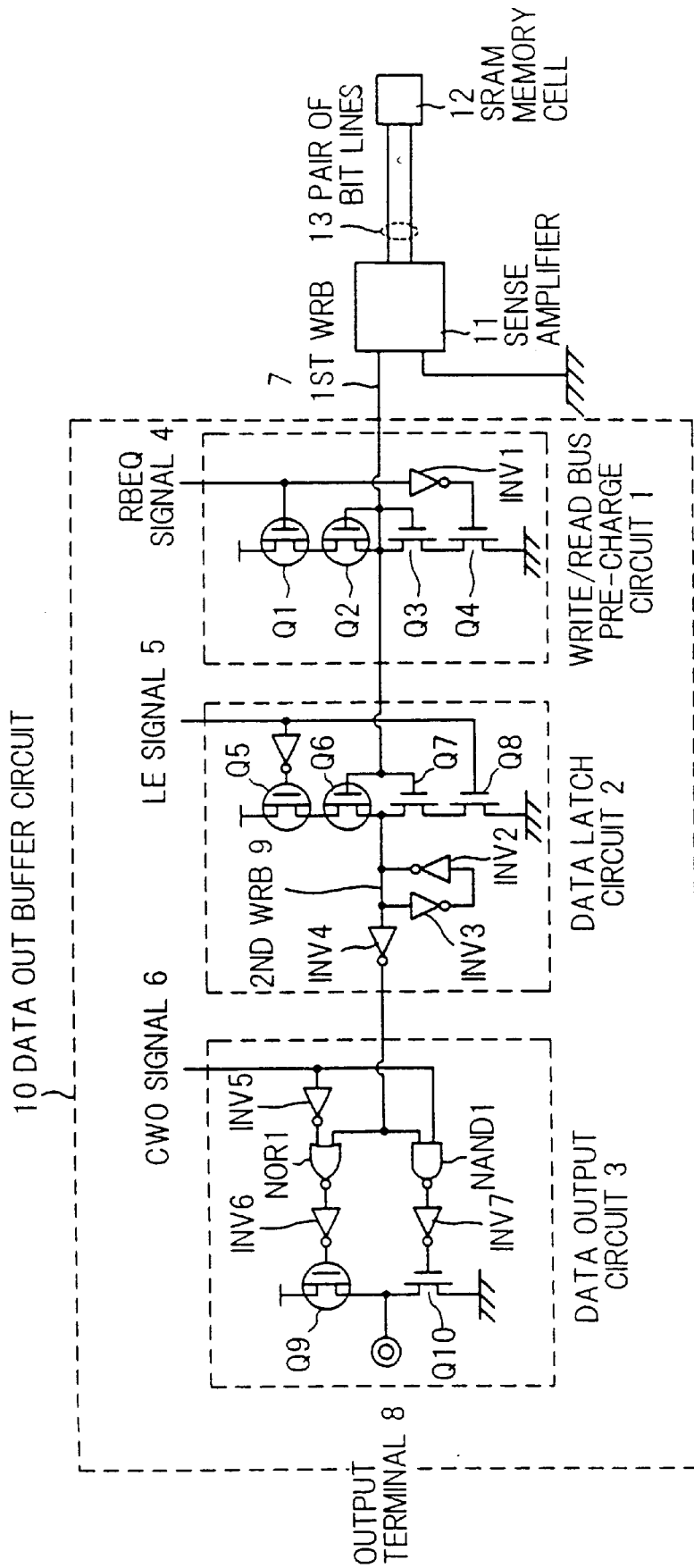
FIG. 3 shows a circuit diagram of a data out buffer circuit according to the first preferred embodiment of the invention and a SRAM according to the same.

Thereafter, the invention will be explained in preferred embodiments. FIG. 3 shows a data out buffer circuit 10 according to the invention as the first preferred embodiment and a SRAM using the same. In FIG.3, a data stored in a SRAM memory cell 12 is read and transmitted to the sense amplifier 11 via a pair of bit lines 13. The data transmitted to the sense amplifier 11 is amplified therein to a discernible level, and transmitted to the data out buffer circuit 10 via the first write/read bus (1ST WRB in the drawing) 7. The data out buffer circuit 10 according to the invention is provided with a data latch circuit 2 in addition to a data output circuit 3 and a write/read bus pre-charge circuit 1, both being used in a conventional data out buffer circuit. The data latch circuit 2 holds a data, which was previously read on the write/read bus 7, during a period of pre-charge.

The write/read bus pre-charge circuit (a RBEQ circuit or a pre-charge circuit, hereinafter) 1 fulfills a function of pre-charging the write/read bus 7, which transmits a signal outputted from the sense amplifier 11 to the data latch circuit 2, and raising a potential thereof to Vcc/2. The pre-charge circuit 1 is formed of a series connection of two PMOS transistors Q1 to Q2 and two NMOS transistors Q3 to Q4. In the PMOS transistor Q1, a source is connected with a power supply having an output voltage of Vcc, a drain is connected with a source of the PMOS transistor Q2, and a gate is supplied with an address transfer detection signal (a RBEQ signal, hereinafter) 4.

A gate and a drain of the PMOS transistor Q2 are connected with the first write/read bus 7. A gate and a drain of the NMOS transistor Q3 are connected with the first write/read bus 7, and a source of the same is connected with a drain of the NMOS transistor Q4. Moreover, a source of the NMOS transistor Q4 is connected with the ground, and a gate of the same is supplied with an inverted signal of the aforementioned RBEQ signal 4 via an inverter INV1.

A data latch circuit 2 comprises a series connection of two PMOS transistors Q5 to Q6 and two NMOS transistors Q7 to Q8. Both drains of a PMOS transistor Q6 and a NMOS transistor Q7 are connected with the second write/read bus (2ND WRB) 9. In the PMOS transistor Q5, a source is connected with a power supply having an output voltage of Vcc, a drain is connected with a source of the PMOS transistor Q6, and a gate is supplied with an inverted signal of a latch control signal (a LE signal, hereinafter) 5 for controlling an operation of a data latch circuit 2. A gate of the PMOS transistor Q6 is connected with the first write/read bus 7. In the NMOS transistor Q7, a drain is connected with the second write/read bus 9, a source is connected with a drain of the NMOS transistor Q8, and a gate is connected with the first write/read bus 7. Moreover, a source of the NMOS transistor Q8 is connected with the ground, and a gate of the same is supplied with a LE signal 5.

The data latch circuit 2 further comprises a flip-flop circuit composed of two inverter circuits INV2 and INV3, and fulfills the function of holding a data on the second write/read bus 9. In the aforementioned structure, when the LE signal is at a high logical level, a signal on the first write/read bus 7 is transmitted to the second write/read bus 9. When the LE signal 5 is at a low logical level, the signal on the second write/read bus 9 is latched. That is to say, the data latch circuit 2 inverts a signal which has been transmitted to the first write/read bus 7 in the period of read, and latches the inverted signal on the second write/read bus 9 responding to the LE signal 5. The signal on the write/read bus 9 is outputted via an inverter INV4 in the data latch circuit 2 during the periods of data-reading and pre-charge.

The data output circuit 3 is composed of a PMOS transistor Q9, a NMOS transistor Q10, three invertors INV5 to INV7, a NAND gate NAND1 and a NOR gate NOR1. Since an data output circuit control signal (a CWO signal) 6 is always at a high logical level, the data output circuit 3 fulfills the function of outputting a data of a high or a low logical level to the outside of the SRAM in accordance with the data held by the data latch circuit 2.

Figure 4:
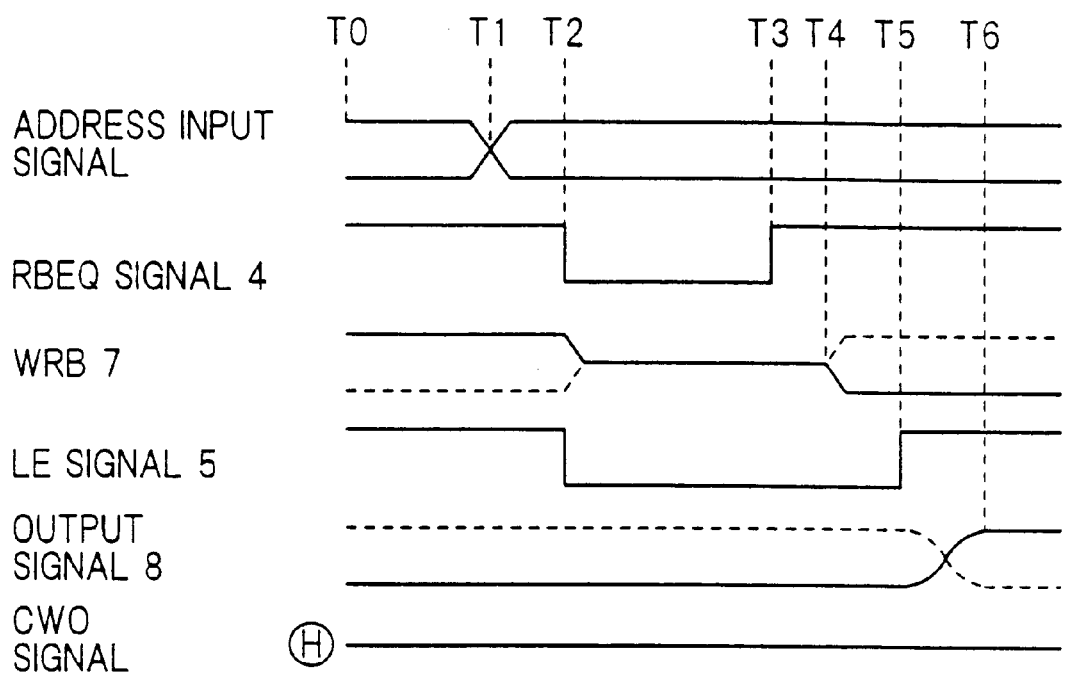
FIG. 4 shows a signal timing chart of an operation of a data out buffer circuit shown in FIG. 3.

FIG.4 shows a timing chart of signals in the data out buffer circuit shown in FIG. 3. At a time T0 in the period of data-reading, the RBEQ signal 4 is at a high logical level, the LE signal 5 is at a high logical level, and the CWO signal 6 is at a high logical level. Now, a potential of the first write/read bus 7 is supposed to be at a high logical level (a power supply voltage Vcc) in accordance with a data to be transmitted.

Since the RBEQ signal 4 is at a high logical level, the PMOS transistor Q1 and the NMOS transistor Q4 are both off, and the write/read bus pre-charge circuit 1 is inoperative. Moreover, since the LE signal 5 is at a high logical level, a data on the first write/read bus 7 of a high logical level is transmitted to the data latch circuit 2, and inverted by a series connection of the PMOS transistor Q5 to the NMOS transistor Q8. The inverted data of a low logical level is transmitted to the second write/read bus 9. Since the CWO signal 6 is at a high logical level, the data output circuit 3 outputs a data of a low logical level to the outside of the SRAM via an output terminal 8.

Next, at a time T1, an address input signal supplied from the outside of the SRAM is supposed to be changed. The change of the address input signal is detected by an address transfer detector circuit (not shown), and, at a time T2, the levels of the RBEQ signal 4 and the LE signal 5 are both changed to a low logical level from a high logical level. At this time, the period of pre-charge starts. Since the level of the LE signal 5 is changed to a low logical level, the PMOS transistor Q5 and the NMOS transistor 8 are both turned off, and the first write/read bus 7 is electrically separated from the data latch circuit 2. Accordingly, the data on the first write/read bus 7 is not transmitted to the second write/read bus 9, and a data of a low logical level is held on the second write/read bus 9.

At this time, since the CWO signal 6 is fixed to a high logical level, the data output circuit 3 continuously supplies a data of a low logical level to the outside of the SRAM. On the other hand, since the RBEQ signal 4 is at a low logical level, the PMOS transistor Q1 and the NMOS transistor Q4 are both turned on, and the pre-charge circuit 1 becomes operative. Since the gate and the drain of the PMOS transistor Q2 are connected with the first write/read bus 7 and the gate and the drain of the NMOS transistor Q3 are connected with the first write/read bus 7, a pre-charge current flows through the pre-charge circuit 1, hence the potential of the first write/read bus 7 is changed to about Vcc/2.

Thereafter, at a time T3, the level of the RBEQ signal is changed to a high logical level, the PMOS transistor Q1 and the NMOS transistor Q4 are again turned off, and the pre-charge circuit 1 becomes inoperative. Since a time T4, a data of a low logical level is supplied to the first write/read bus 7 from the sense amplifier, and the potential of the first write/read bus 7 is changed to a low logical level, in other words, the ground potential.

Moreover, since the level of the LE signal 5 is changed to a high logical level at a time T5, the PMOS transistor Q5 and the NMOS transistor Q8 are again turned on, and the data of a low logical level on the write/read bus 7 is transmitted to the data latch circuit 2. Since the data transmitted to the data latch circuit 2 from the write/read bus 7 is inverted by the series connection of the PMOS transistor Q5 to the NMOS transistor Q8, the data of a high logical level is held in the data latch circuit 2. Since the level of the CWO signal 6 is fixed to a high logical level, the data of a high logical level is outputted from the data output circuit 3 since a time T6.

According to the aforementioned embodiment, the output data-holding time of the data out buffer circuit can be extended as compared with that of the conventional one, and the access speed can be improved by adopting a pre-charge circuit, by which the potential of the write/read bus is raised to Vcc/2 in advance of data-reading. These effects can be achieved because the output data can be held during the period of pre-charge by the data latch circuit. That is to say, the improvement of access speed obtained by the pre-charge system and the insurance of the period for data-reading by means of the data latch circuit can stand together according to the invention. In the aforementioned embodiments, on-resistances of the PMOS transistors Q1 to Q2 and the NMOS transistors Q3 to Q4 are nearly the same.

Figure 5:
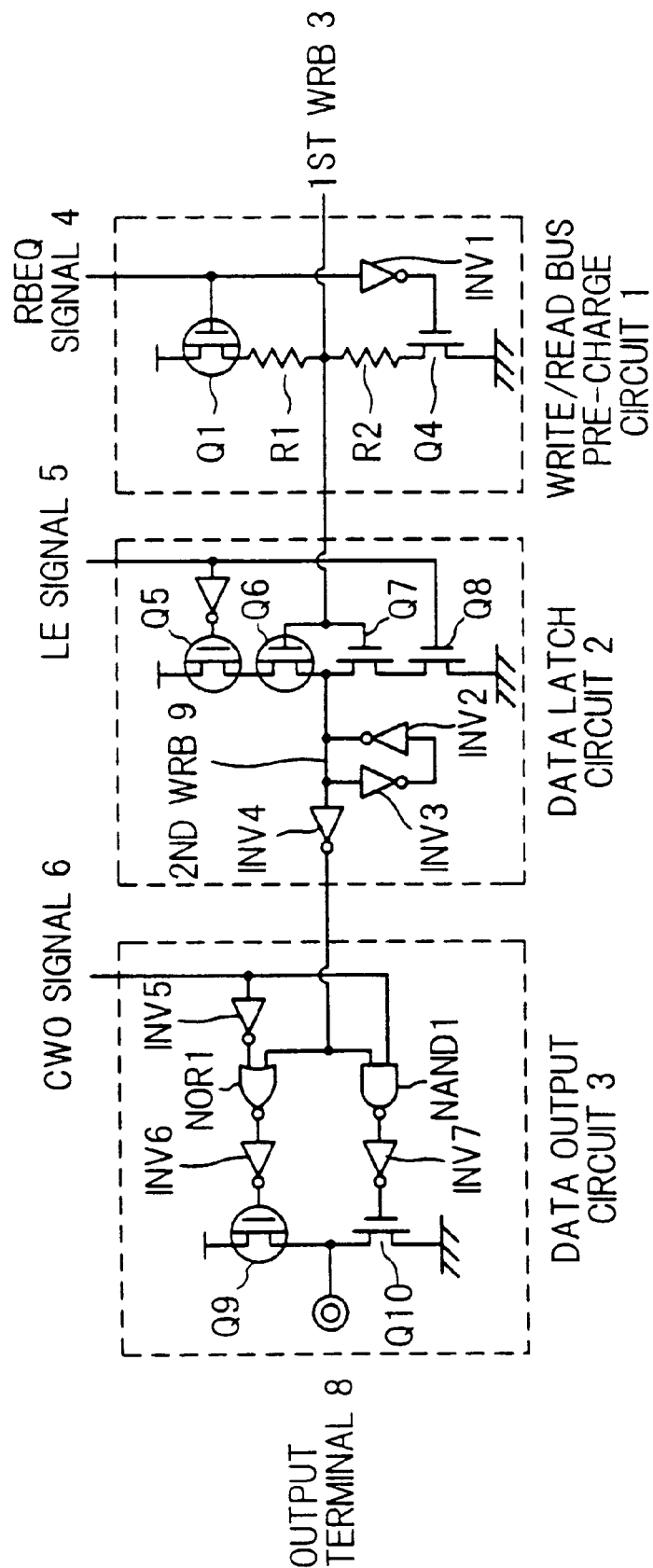
FIG. 5 shows a circuit diagram of a data out buffer circuit according to the second preferred embodiment of the invention.

FIG. 5 shows another data out buffer circuit according to a second preferred embodiment of the invention. In this embodiment, the pre-charge circuit 1 is composed of a PMOS transistor Q1, a NMOS transistor Q4, both serving as switching transistors, and two resistors R1 to R2, both respectively having nearly the same resistances as on-resistances of the PMOS transistors Q1 and the NMOS transistor Q4.

In this embodiment, the pre-charge level of the write/read bus is determined by $$Vcc \times R2/(R1+R2).$$

Since the ratio of the R1 to R2 is uniquely determined by a mask pattern, the resistances do not fluctuate. Accordingly, the fluctuation of the pre-charge level of the write/read bus caused by imperfection of the fabrication process, which cannot be neglected in the data out buffer circuit according to the first preferred embodiment, can be suppressed within a small value.

According to the data out buffer circuit according to the invention, the reliability of the data transmission achieved by the extended holding time of the output data and the improvement of access speed achieved by pre-charge can both be realized.

What is claimed is:

1. A data out buffer circuit comprising:
    a single-phase write/read bus supplied with data operative to be read in a read period,
    a pre-charge circuit operatively connected to a power supply voltage to maintain a potential of said single-phase write/read bus at a predetermined level during a pre-charge period,
    a data latch circuit operative to latch said data to be read during said pre-charge period subsequent to said read period, wherein said data is a single-phase signal having a full swing of an amplitude of said power supply voltage, and
    a data output circuit operative to transmit an output of said data latch circuit.

2. A data out buffer circuit according to claim 1, wherein:
    said predetermined level is nearly equal to a half of said power supply voltage.

3. A data out buffer circuit according to claim 1, wherein:
    said pre-charge circuit comprises a series connection of a first PMOS transistor, a second PMOS transistor, a first NMOS transistor and a second NOMS transistor,
    wherein said series connection is inserted between a first power supply and a second power supply.

4. A data out buffer circuit according to claim 1, wherein:
    said pre-charge circuit comprises a series connection of a PMOS transistor, a first resistor, a second resistor and a NMOS transistor,
    wherein on-resistances of said PMOS and NOMS transistors are respectively nearly equal to resistances of said first and second resistors and said series connection is inserted between a first power supply and a second power supply.

5. A data out buffer circuit according to claim 1, wherein:
    said potential of said single-phase write/read bus is changed between a first power supply voltage and a first power supply voltage in full swing.

6. A static random access memory SRAM comprising:
a data out buffer circuit, which comprises
  a single-phase write/read bus supplied with data to be read in a read period,
  a pre-charge circuit operative to maintain a potential of said single-phase write/read bus at a predetermined level during a pre-charge period,
  a data latch circuit operative to latch said data to be read during said pre-charge period subsequent to said read period, and
  a data output circuit operative to transmit an output of said data latch circuit;
a SRAM memory cell for storing said data to be read, and
a sense amplifier for amplifying said data read from said SRAM memory cell, and supplying it to said single-phase write/read bus.

* * * * *